(12) United States Patent
Homutescu

(10) Patent No.: US 12,302,522 B2
(45) Date of Patent: May 13, 2025

(54) HOUSING FOR AN ELECTRONIC CIRCUIT WHICH IS ARRANGED ON A PRINTED CIRCUIT BOARD

(71) Applicant: Continental Automotive Technologies GmbH, Hannover (DE)

(72) Inventor: Adrian Homutescu, Iasi (RO)

(73) Assignee: Continental Automotive Technologies GmbH, Hannover (DE)

( * ) Notice: Subject to any disclaimer, the term of this patent is extended or adjusted under 35 U.S.C. 154(b) by 220 days.

(21) Appl. No.: 18/026,263

(22) PCT Filed: Sep. 2, 2021

(86) PCT No.: PCT/EP2021/074202
§ 371 (c)(1),
(2) Date: Mar. 14, 2023

(87) PCT Pub. No.: WO2022/053379
PCT Pub. Date: Mar. 17, 2022

(65) Prior Publication Data
US 2023/0363095 A1     Nov. 9, 2023

(30) Foreign Application Priority Data

Sep. 14, 2020  (EP) ..................................... 20465557
Sep. 18, 2020  (DE) ..................... 10 2020 211 730.6

(51) Int. Cl.
*H05K 5/00* (2025.01)
*H05K 5/15* (2025.01)
(Continued)

(52) U.S. Cl.
CPC ............... *H05K 5/15* (2025.01); *H05K 5/006* (2013.01); *H05K 7/1417* (2013.01); *H05K 1/0278* (2013.01)

(58) Field of Classification Search
CPC .... H05K 5/0047; H05K 5/0043; H05K 5/006; H05K 2201/09063; H05K 2203/167
See application file for complete search history.

(56) References Cited

U.S. PATENT DOCUMENTS 9,585,263 B2    2/2017 Matoy
9,844,140 B2 *  12/2017 Oba ..................... H05K 5/0052
(Continued)

FOREIGN PATENT DOCUMENTS

DE   102004011032 A1   4/2005
DE   102005046053 A1   3/2007
(Continued)

OTHER PUBLICATIONS

Office Action dated Jul. 24, 2024 from corresponding Korean patent application No. 10-2023-7005037.
(Continued)

*Primary Examiner* — Hoa C Nguyen
*Assistant Examiner* — Amol H Patel

(57) ABSTRACT

A housing for an electronic circuit comprises tub-shaped lower and upper parts and a rectangular printed circuit board, PCB. The lower part comprises PCB supports and molded position fixing formations on opposite inner walls and first parts of latching apparatuses, for connecting to the upper part, on opposite outer walls. The formations positionally fix the PCB by engaging into matching fixing slots therein. The PCB has, in each corner, a slot parallel to the inner walls with the supporting elements forming elongate, resilient tabs, the length of the slots greater than the spacing of the respective slot from the adjacent PCB edge. The upper part comprises pins protruding out of the plane of the edge and pressing the resilient tabs out of the PCB plane into the
(Continued)

Figure 1:
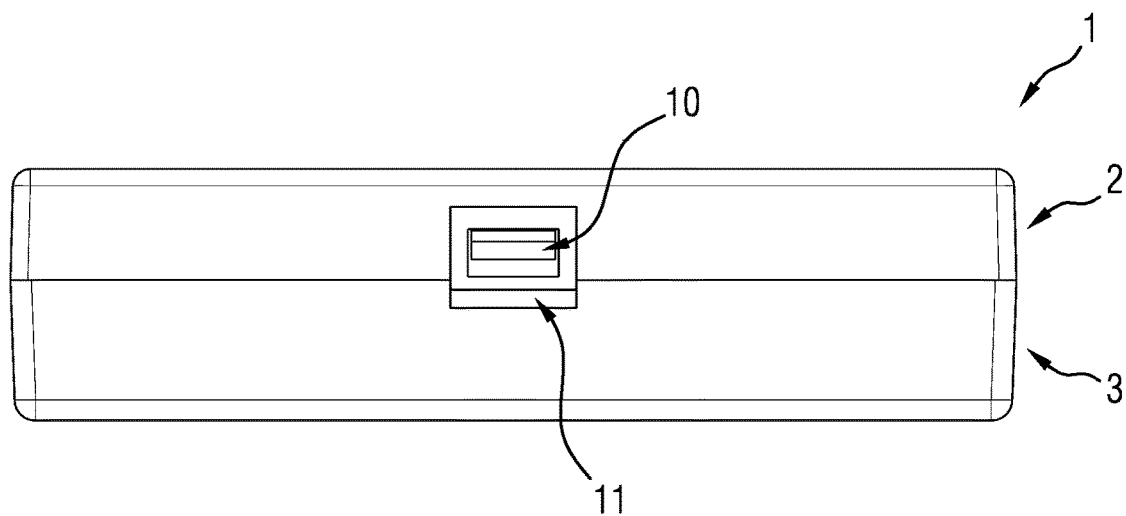

lower part, with the housing assembled, and, on opposite outer walls, second parts of the latching apparatus for connecting to the lower part.

6 Claims, 10 Drawing Sheets

(51) Int. Cl.
*H05K 7/14* (2006.01)
*H05K 1/02* (2006.01)

(56) References Cited

U.S. PATENT DOCUMENTS

| | | | |
|---|---|---|---|
| 2005/0068750 A1* | 3/2005 | Origlia | H05K 5/0043 |
| | | | 361/752 |
| 2008/0248679 A1 | 10/2008 | Kuo | |
| 2019/0373718 A1* | 12/2019 | Shinohara | H05K 1/0271 |
| 2020/0113044 A1* | 4/2020 | Blake, III | H05K 1/141 |
| 2021/0352815 A1* | 11/2021 | Kraemer | H05K 5/0052 |
| 2023/0255009 A1* | 8/2023 | Takahashi | H05K 9/0039 |
| | | | 361/818 |

FOREIGN PATENT DOCUMENTS

| | | |
|---|---|---|
| DE | 102009008527 A1 | 8/2010 |
| DE | 102010034975 A1 | 2/2012 |
| DE | 202015106042 U1 | 2/2017 |
| DE | 102019215398 A1 | 4/2020 |
| JP | H07336071 A | 12/1995 |
| JP | H0888482 A | 4/1996 |
| JP | H10190256 A | 7/1998 |
| JP | 2000244152 A | 9/2000 |
| JP | 2001339174 A | 12/2001 |
| JP | 2011233767 A | 11/2011 |
| JP | 2016162944 A | 9/2016 |
| JP | 2019216174 A | 12/2019 |
| JP | 2021059476 A | 4/2021 |

OTHER PUBLICATIONS

Office Action dated Apr. 29, 2021 from corresponding German patent application No. 10 2020 211 730.6.
International Search Report and Written Opinion dated Dec. 23, 2021 from corresponding International patent application No. PCT/EP2021/074202.
Office Action mailed May 14, 2024 from corresponding Japanese patent application No. 2023-516531.
Notice of Allowance dated Feb. 11, 2025 from corresponding Korean patent application No. 10-2023-7005037.

* cited by examiner

A-A

B-B

C-C

E-E

HOUSING FOR AN ELECTRONIC CIRCUIT WHICH IS ARRANGED ON A PRINTED CIRCUIT BOARD

The invention relates generally to the centering and fixing of a printed circuit board within the housing of an electronic control unit.

Control units of this type, in particular USB boxes, which are provided with at least one printed circuit board which is arranged within a housing are known in the prior art. Here, the housings have openings which make it possible that external plug-in connecting parts can be connected to plug-in connecting parts which are compatible with them and are positioned on the printed circuit board.

Here, the printed circuit board has to be centered precisely within the housing, with the result that the plug-in connectors are positioned predictably after the connection, centering topologies being used which have centering pins which engage into centering holes. Moreover, the fixing of the printed circuit board is achieved within the box, with the result that no rattling or decentering of the printed circuit board can occur during use.

According to the prior art, the fixing takes place by way of screws or elastic snap fasteners. The centering takes place by way of centering pins and centering holes. The fixing and centering regions take up a considerable proportion of the printed circuit board area, as a result of which the proportion which is available for components is decreased.

It is therefore the object of the invention to specify a housing for an electronic circuit which is arranged on a printed circuit board, which housing can be assembled in a simple way and in the process makes a high positional accuracy and stability of the printed circuit board possible.

The object is achieved by way of a housing as claimed in claim 1. Advantageous developments are specified in the dependent claims.

Accordingly, a housing according to the invention for an electronic circuit has a housing lower part, a housing upper part and a printed circuit board which is arranged in the housing and serves to receive the electronic circuit. The housing lower part is of tub-shaped configuration and has in each case at least two supporting elements for the printed circuit board on at least two inner walls which lie opposite one another, and has, moreover, in each case at least one molded position fixing formation on at least two inner walls which lie opposite one another, which molded position fixing formation serves to engage into a matching fixing slot in the printed circuit board in order to positionally fix the latter. Moreover, the housing lower part has in each case one first part of a latching apparatus for connecting to the housing upper part on at least two outer walls which lie opposite one another. The printed circuit board is of rectangular configuration and has stabilizing slots for receiving the molded position fixing formations of the housing lower part on at least two sides which lie opposite one another. At its four corners, the printed circuit board has in each case one slot which runs parallel to that inner wall of the housing lower part, to which the supporting elements are attached, the length of a slot being greater than the spacing of the slot from the adjacent printed circuit board edge, with the result that an elongate, resilient tab is formed at each corner of the printed circuit board. The housing upper part is of tub-shaped configuration and, at its four corners, has pins which protrude out of the plane of the housing upper part edge and are intended to press the tabs which are configured on the printed circuit board out of the printed circuit board plane into the housing lower part in the assembled state of the housing, and has, moreover, in each case one second part of the latching apparatus for connecting to the housing lower part on at least two outer walls which lie opposite one another.

As a result, an assembly concept of a lid and a bottom part of the housing is described, which assembly concept does not require any screws or other additional fastening elements for a printed circuit board which is to be arranged therein.

In one advantageous embodiment of the housing, the latching apparatus is formed with a latching lug as first part and the resilient bracket as second part, or vice versa.

A particularly simple connection of the housing lower part to the housing upper part is realized as a result.

In one development of the housing according to the invention, at least one molded position fixing formation can be integrally molded on each inner wall of the housing lower part, in particular during the production of the housing lower part.

The position fixing arrangements can be configured both as pins or lugs or in an advantageous way as housing ribs.

The supporting elements can also advantageously be configured as housing ribs.

In one advantageous embodiment, the supporting elements are arranged in the housing lower part in such a way that the printed circuit board comes to lie on them with rest regions which lie in a direct extension of the ends of the resilient tabs.

In this way, the supporting elements form a back support for the pins which press the tabs of the printed circuit board downward.

Figure 2:
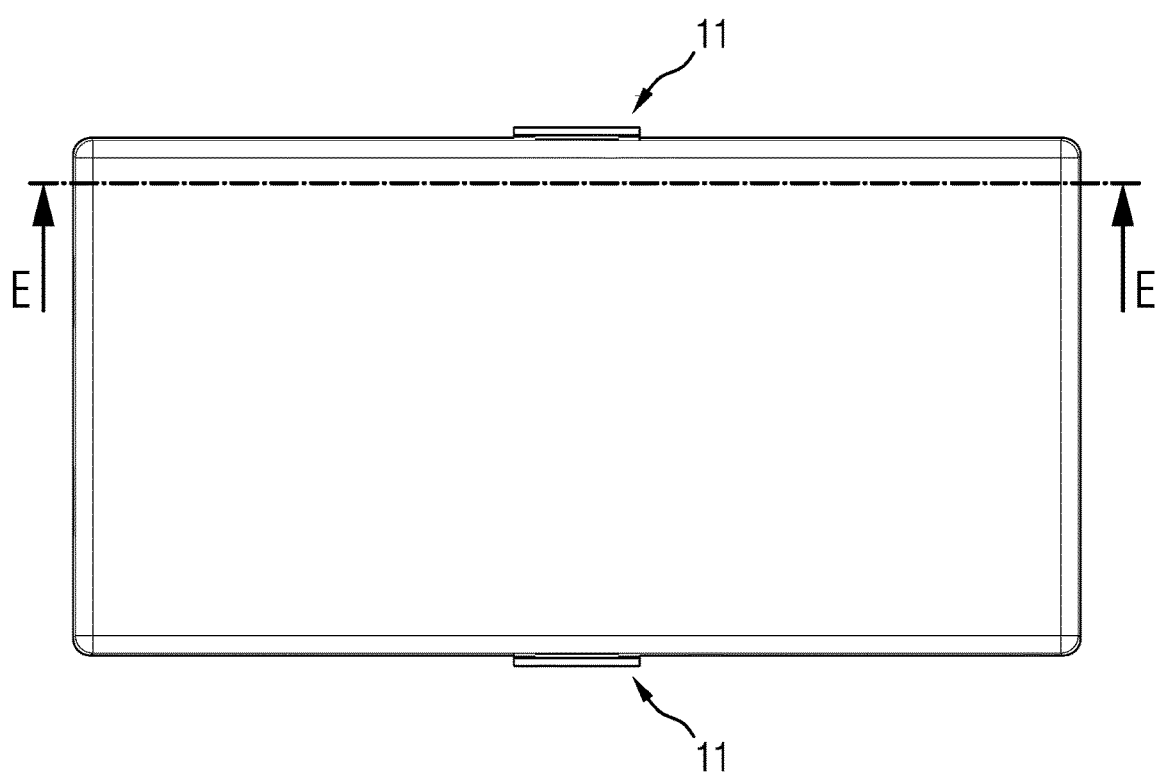
Figure 3:
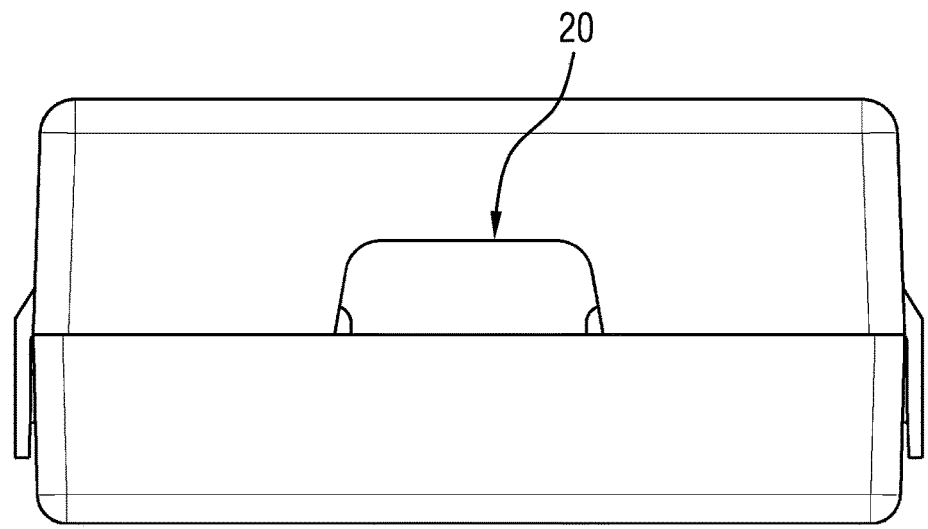
Figure 4:
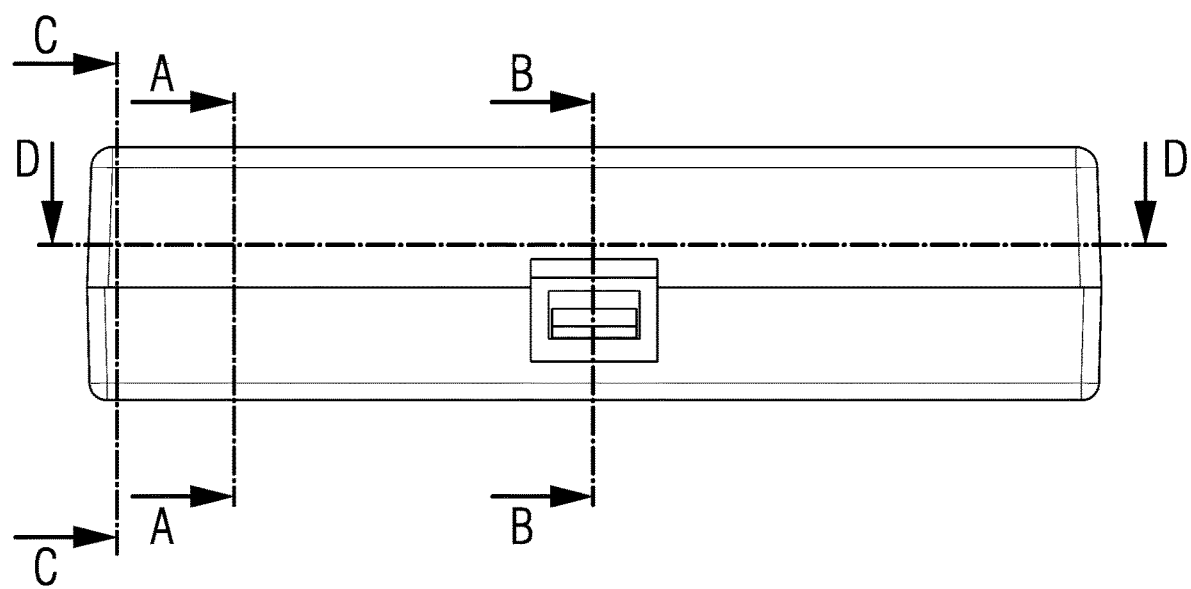
Figure 5:
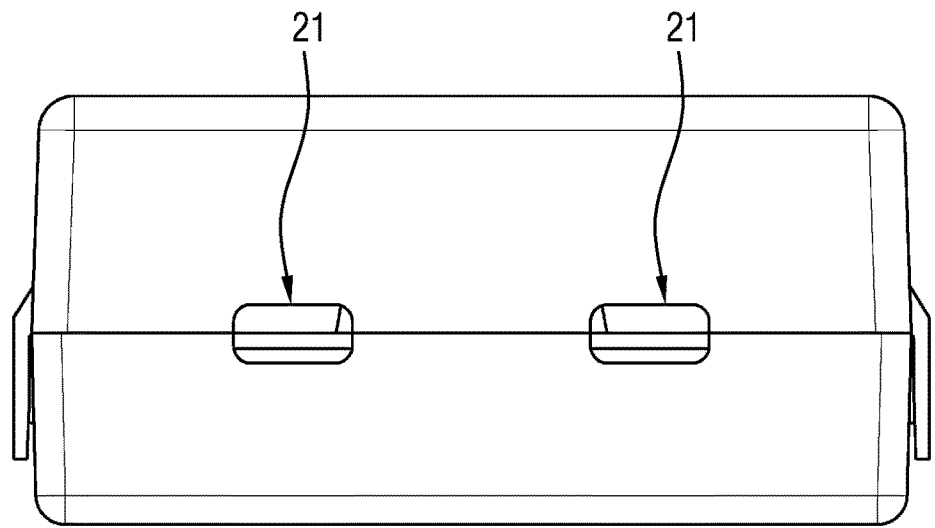
Figure 6:
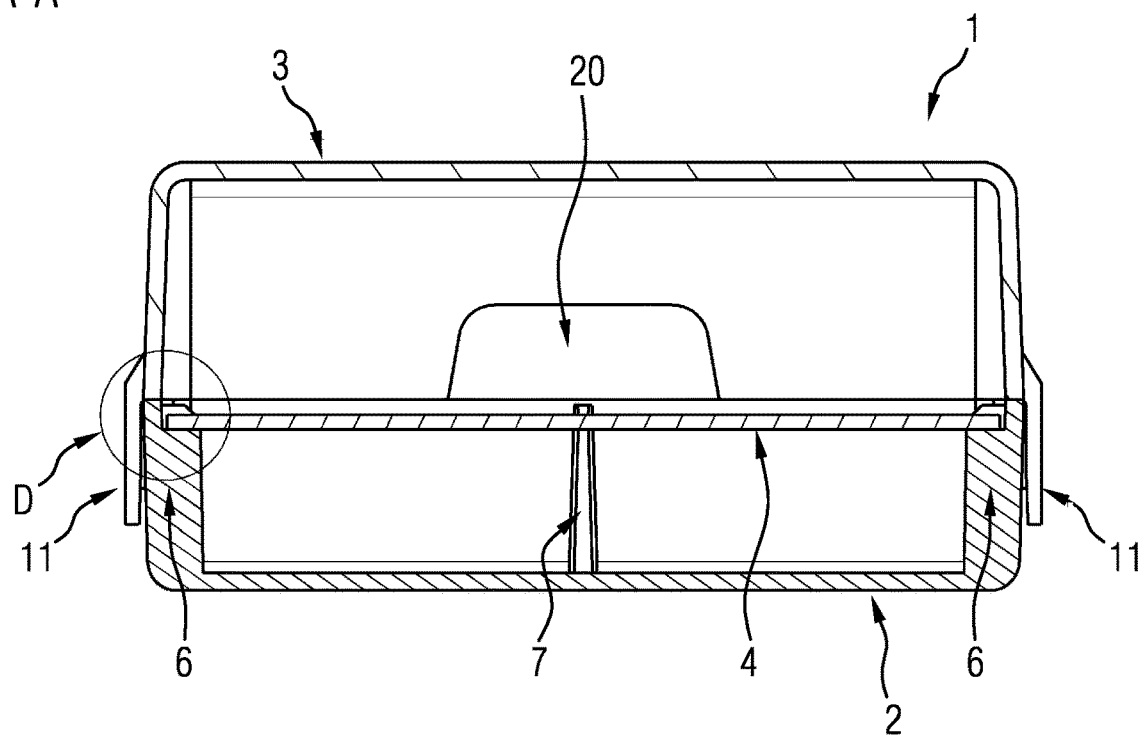
Figure 7:
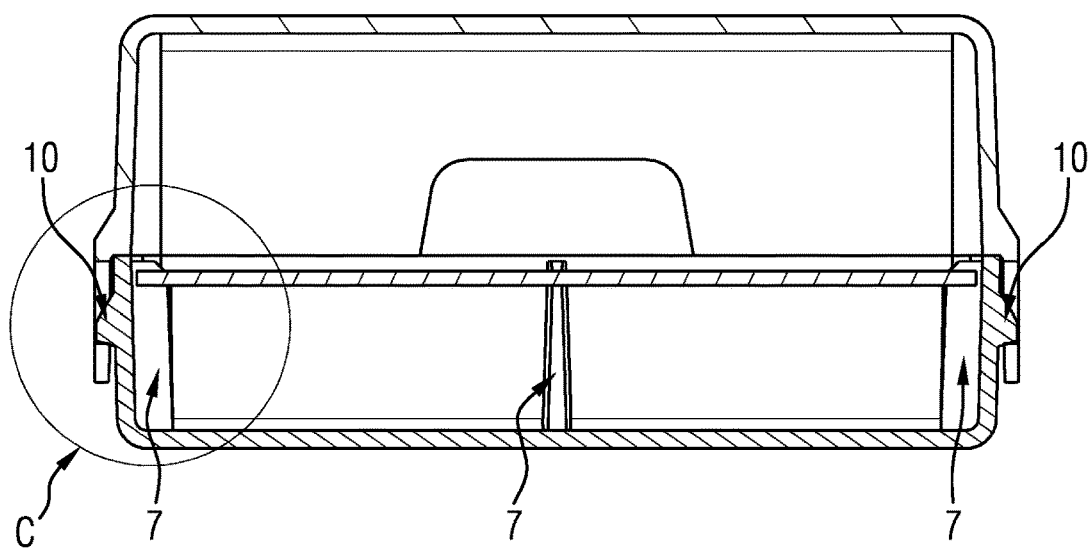
Figure 8:
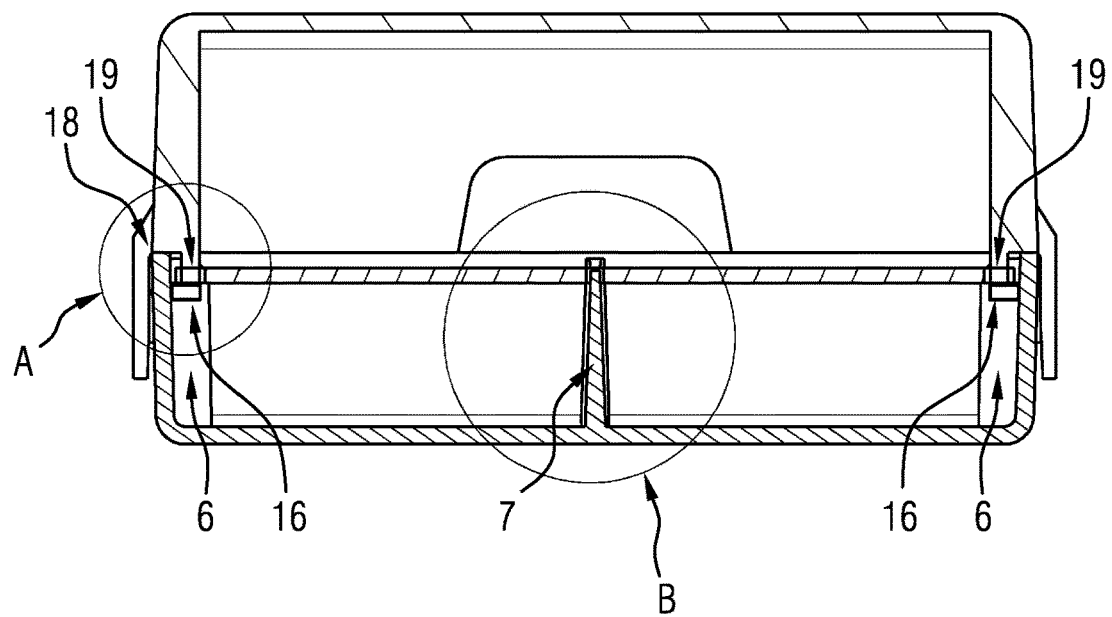
Figure 9:
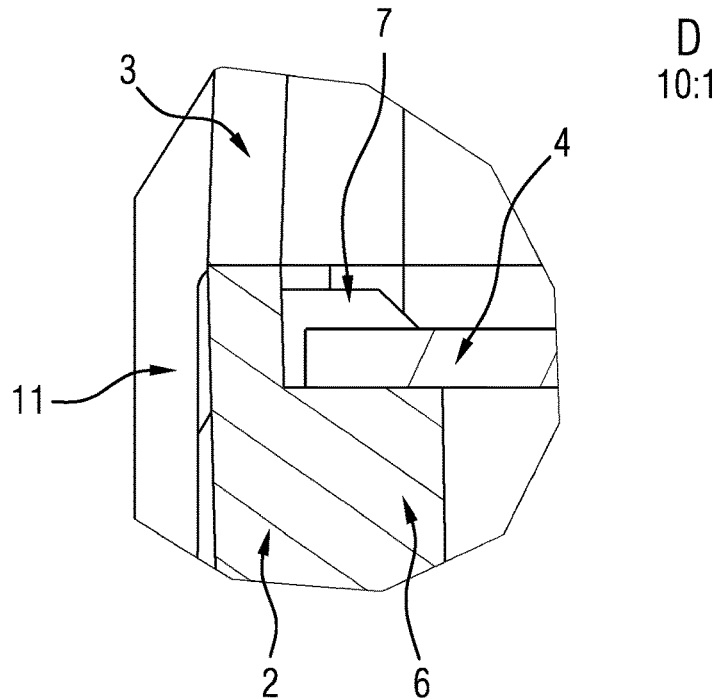
Figure 10:
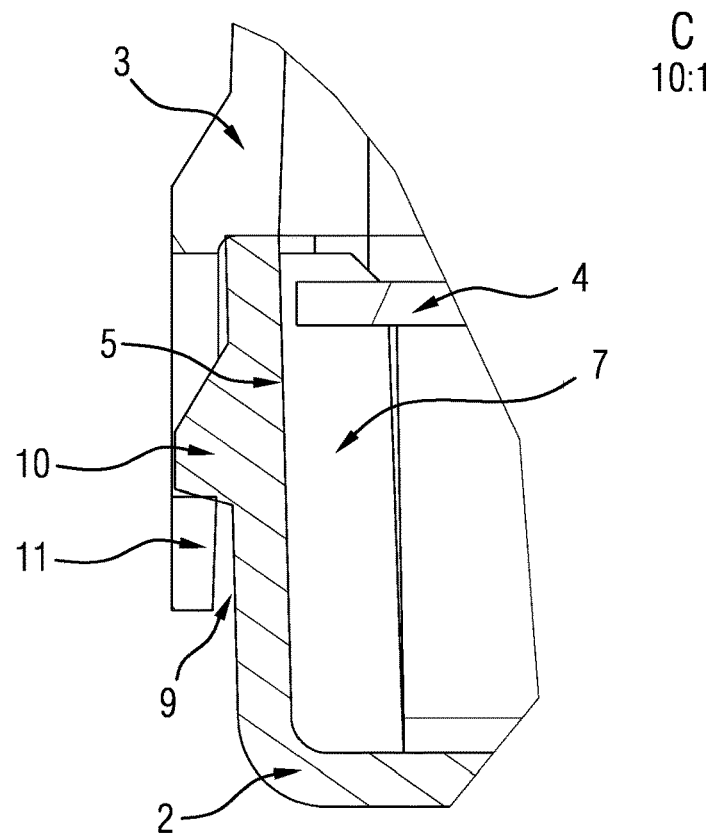
Figure 11:
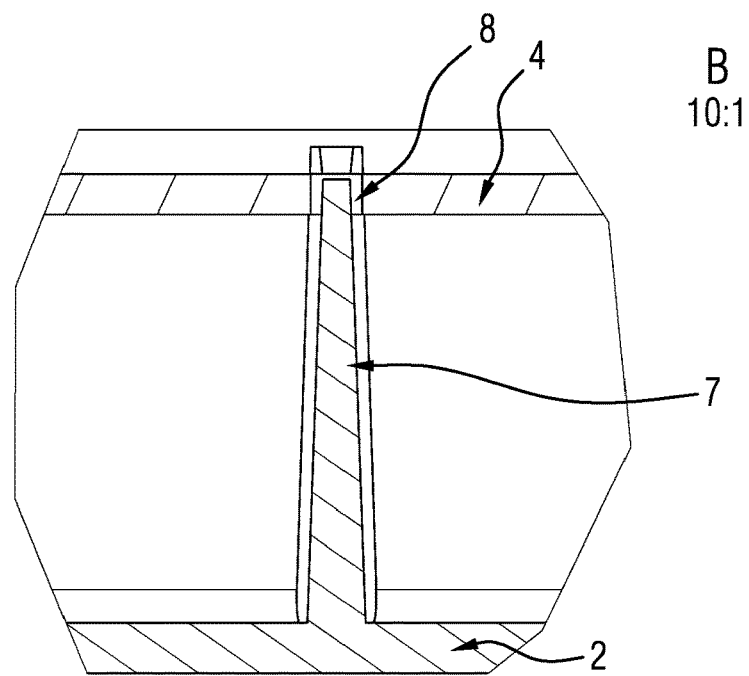
Figure 12:
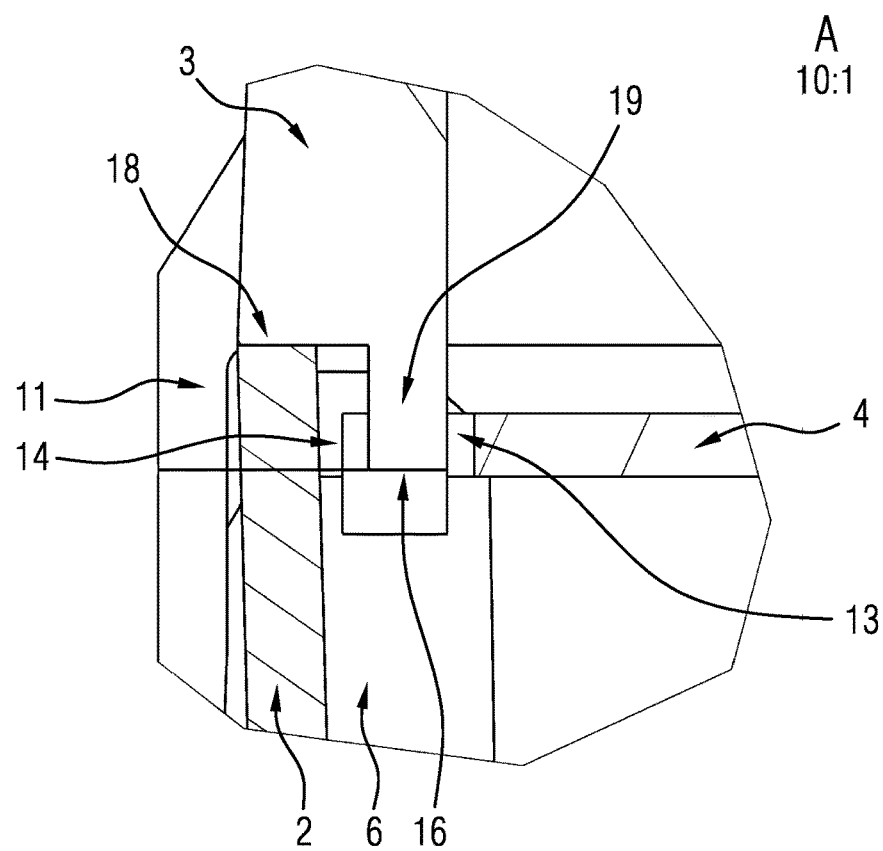
Figure 13:
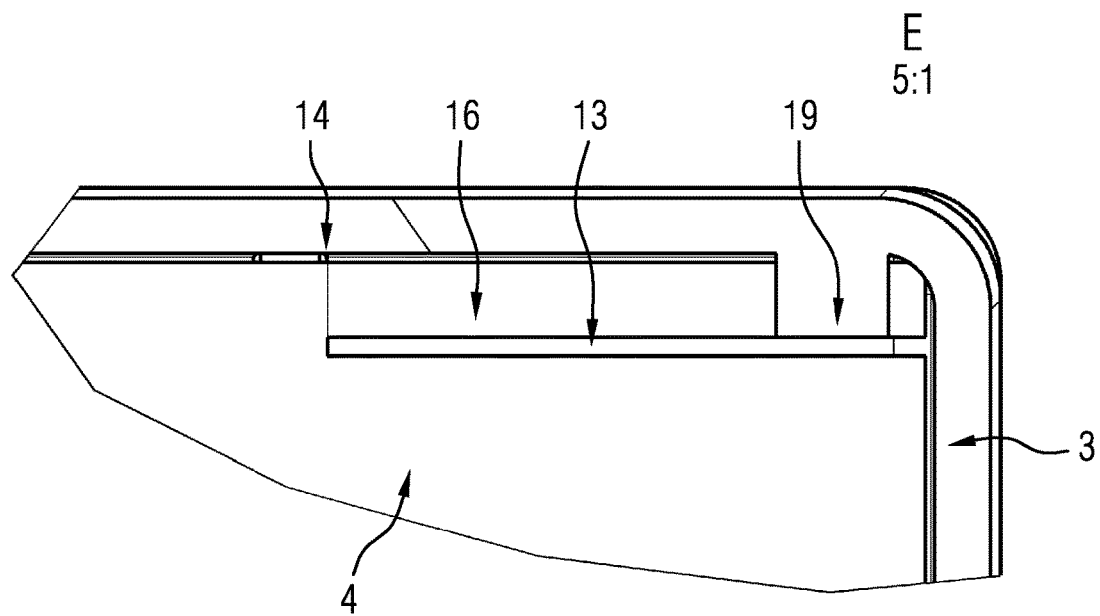
Figure 14:
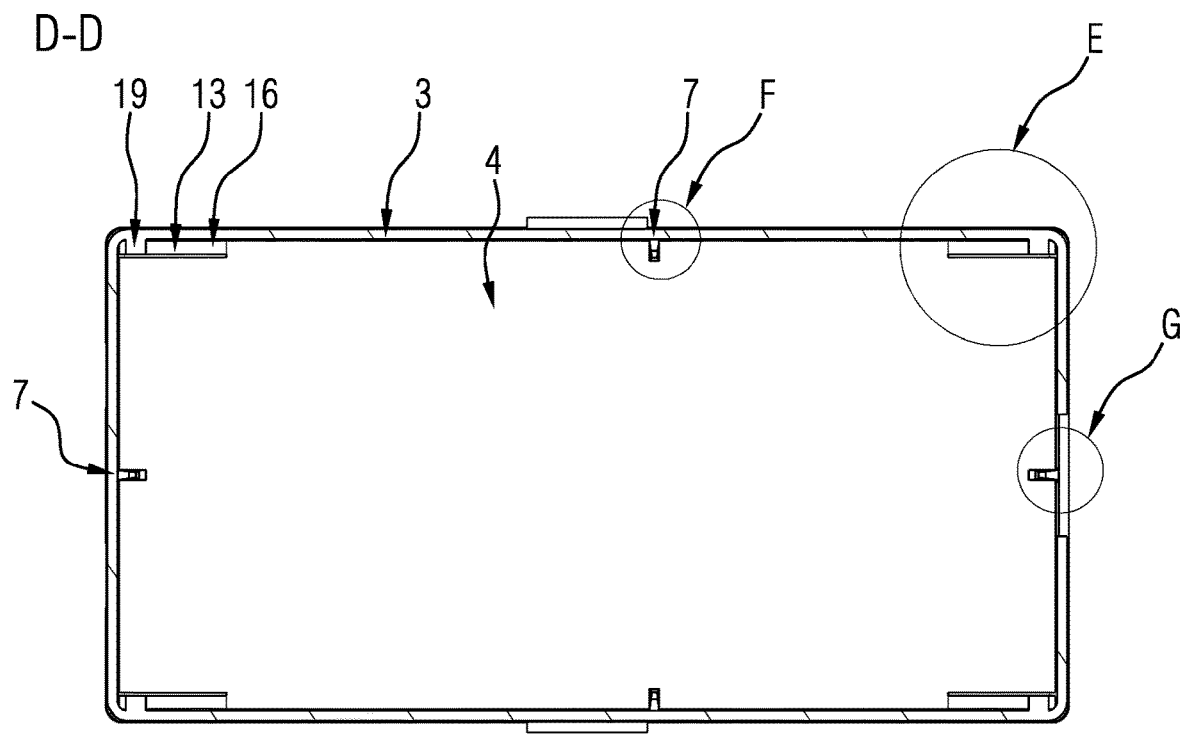
Figure 15:
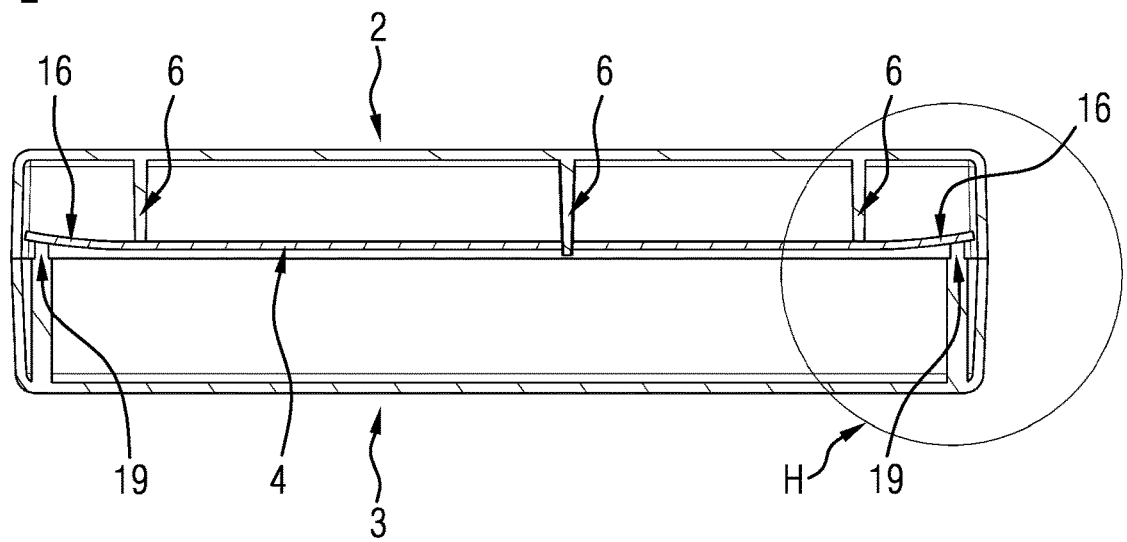
Figure 16:
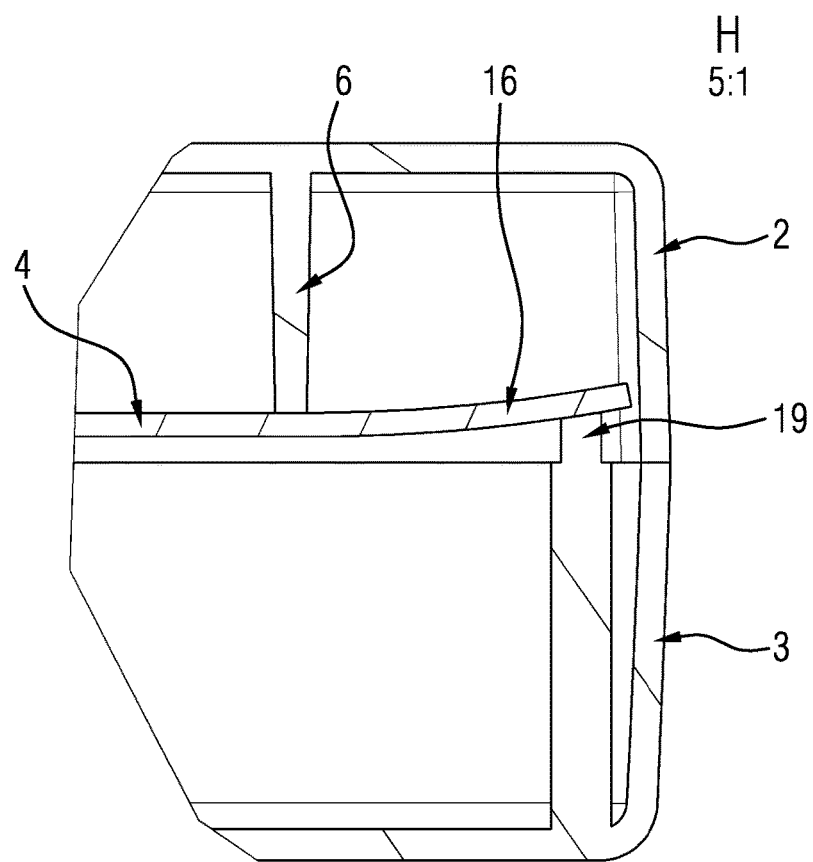
Figure 17:
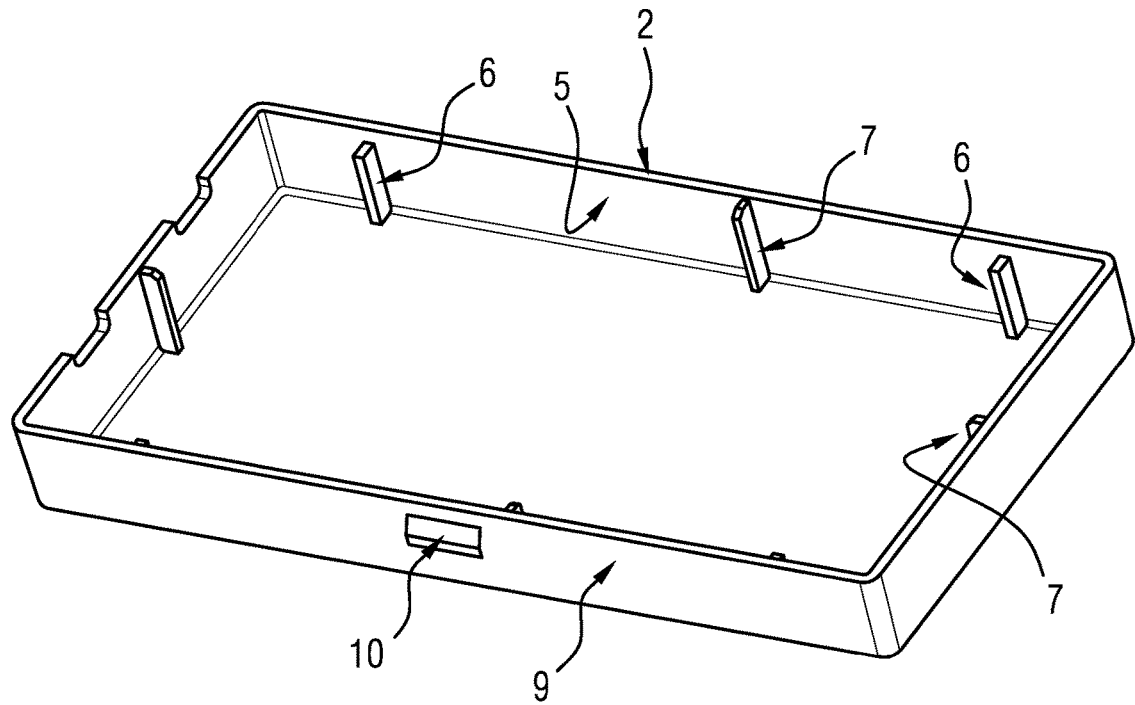
Figure 18:
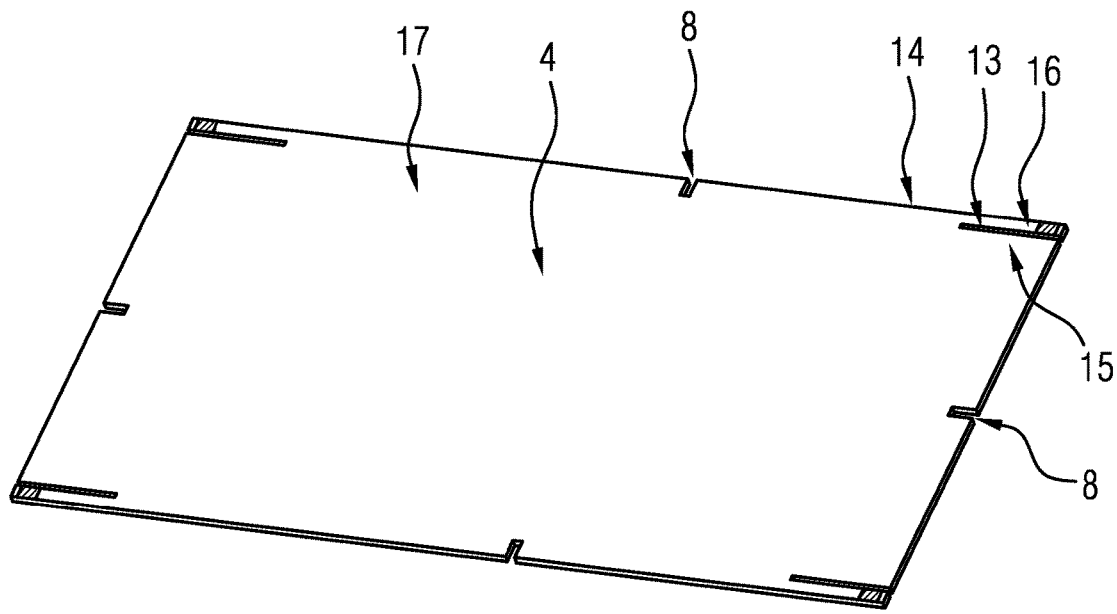
Figure 19:
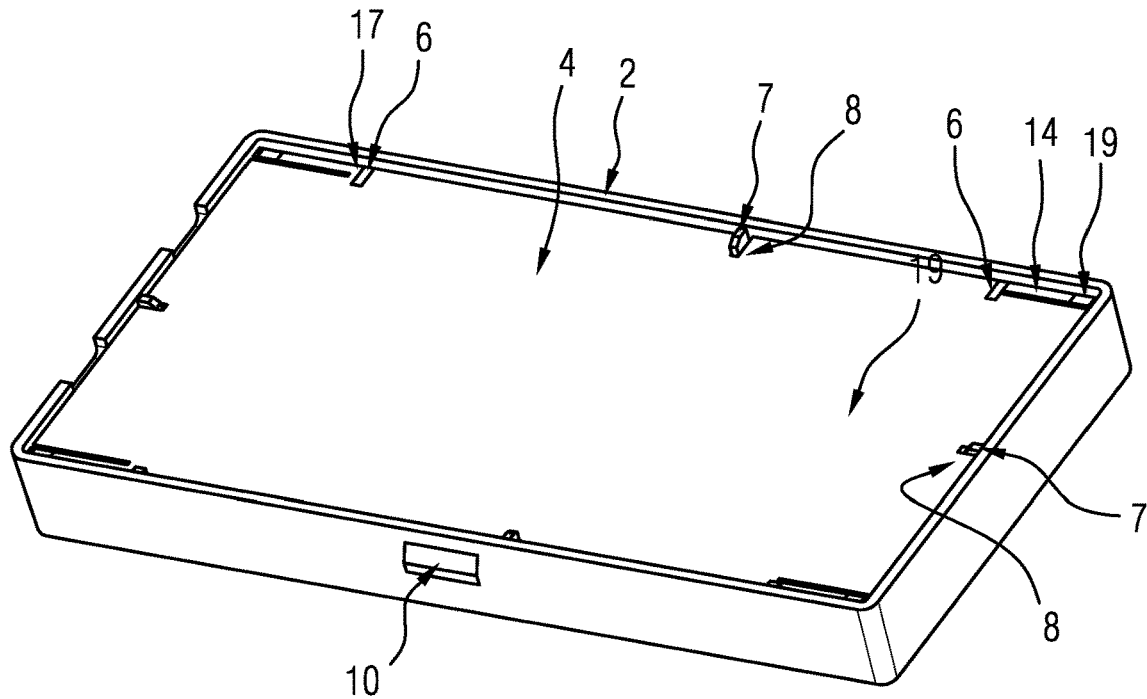
Figure 20:
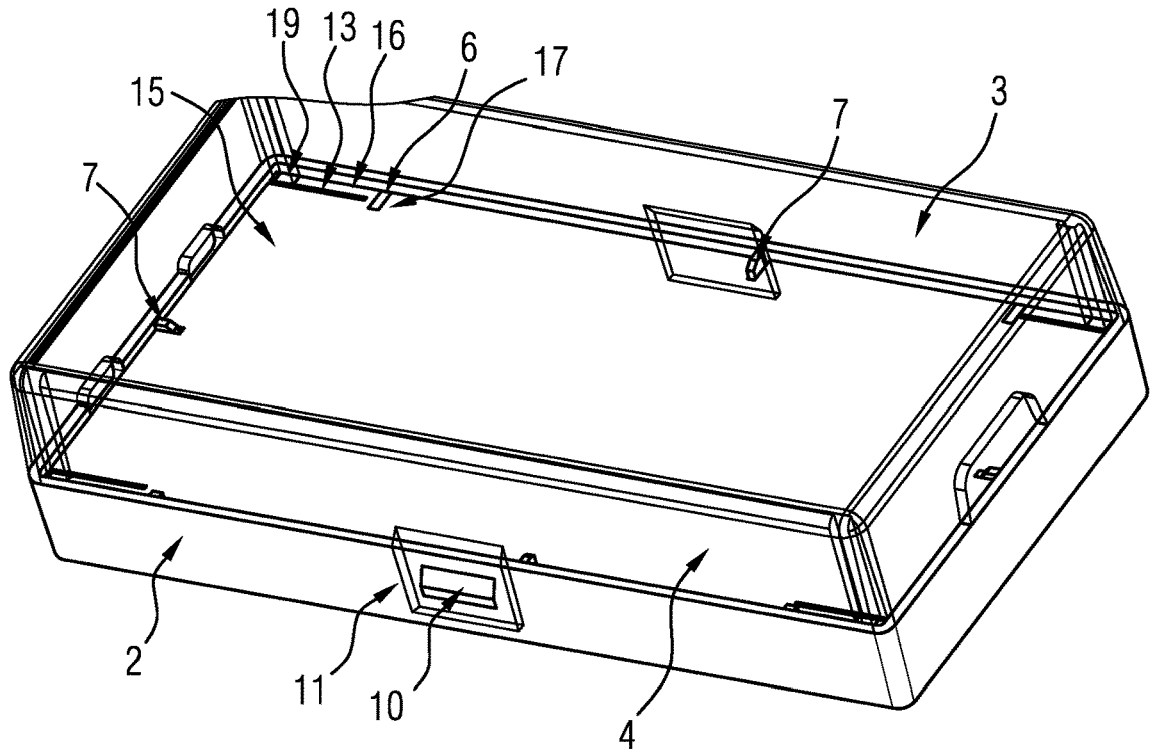

The invention is to be described in greater detail in the following text on the basis of one exemplary embodiment with the aid of figures, in which:

FIG. 1 to FIG. 5 show side views of a housing according to the invention, FIGS. 6 to 8 show the sections (shown in FIG. 4) through the housing at different locations, FIGS. 9 to 11 show the details indicated in FIGS. 6 to 8, FIG. 12 shows the detail A indicated in FIG. 8, FIG. 13 shows the detail E indicated in FIG. 14, FIG. 14 shows the cross section D-D indicated in FIG. 4, FIG. 15 shows the cross section E-E indicated in FIG. 2, FIG. 16 shows the detail H indicated in FIG. 15, FIG. 17 shows a perspective illustration of the housing lower part, FIG. 18 shows a perspective illustration of the printed circuit board, FIG. 19 shows a perspective illustration of the housing lower part with an inserted printed circuit board (shown in transparent form), and FIG. 20 shows a perspective illustration of the housing lower part, the printed circuit board (shown in transparent form) and the housing upper part (shown in transparent form).

FIGS. 1 to 5 show different views of a housing 1, with a housing lower part 2 and a housing upper part 3. The designations are only shown in some figures, for the sake of clarity. The details are readily revealed to a person skilled in the art on account of their knowledge of workshop drawings.

The housing lower part 2 has a first part of the latching apparatus 10, and the housing upper part 3 has a second part of a latching apparatus 11. The first part of the latching apparatus 10 is configured here in the example which is shown as a latching lug, while the second part of the latching apparatus 11 is configured as an elastic bracket which can be clipped over the latching lug 10. It goes without saying that the parts are replaceable and can also be realized by different types of snap-in connections or different types of other connections. It is essential that the housing parts are connected to one another releasably.

FIG. 3 shows a side view of a first plug opening 20 in the housing upper part, and FIG. 5 shows the side view of two further second plug openings 21 both in the housing upper part and in the housing lower part. The first and second plug openings 20, 21 serve to make the connection of external plug-in connector parts, for example plugs, to internal plug-in connector parts, for example sockets, mounted on the printed circuit board 4 possible.

The positioning and fixing according to the invention (shown in the following text) of the printed circuit board which supports part of the plug-in connections serve primarily to design said plug-in connections to be mechanically stable, without it being necessary here to resort to screw connections or other complicated connections.

FIG. 6 shows a section through the line A-A indicated in FIG. 4 and shows the housing lower part 2 and the housing upper part 3 with the printed circuit board 4 which is arranged therein and lies on the supporting elements 6 in the housing lower part 2. Moreover, the first plug opening 20 and the second part of the latching apparatus 11 which, in the exemplary embodiment which is shown, is configured as a bracket which can snap over a latching lug (which cannot be seen here) can be seen in said section. Moreover, a molded position fixing formation 7 can be seen which is configured as a housing rib in the housing lower part 2 and, as can be gathered, in particular, from FIGS. 14 and 18, engages into fixing slots 8 in the printed circuit board 4.

In the exemplary embodiment which is shown, the molded position fixing formations 7 are configured as housing ribs in the housing lower part 2, but they can also be integrally molded onto the housing lower part 2 as lugs or pins and can have merely approximately the thickness of the printed circuit board 4. It is essential that they fix the position of a printed circuit board 4 which lies on the supporting elements 6.

FIG. 7 shows a section B-B through the housing 1 which lies at the location of the latching apparatus; the first part of the latching apparatus 10 can also be seen here in the form of a latching lug. Moreover, lateral molded position fixing formations 7 can also be seen which engage into fixing slots 8 (which cannot be seen here) of the printed circuit board 4.

FIG. 8 shows a cross section at the location C-C, as can be gathered from FIG. 4; supporting elements 6 can be seen here, on which the printed circuit board 4 lies. Moreover, a molded position fixing formation 7 can be seen in section, since the section C-C runs close to a wall of the housing lower part 2.

Elongate, resilient tabs 16 can likewise be seen which are a constituent part of the printed circuit board 4 and will be described in detail later. Said tabs 16 are pressed out of the plane of the printed circuit board 4 into the housing lower part 2 by way of pins 19 which are integrally molded onto the housing upper part 3, in order to fix the printed circuit board 4 mechanically in the housing 1.

FIG. 9 shows a detailed view D from FIG. 6, in which a supporting element 6, on which the printed circuit board 4 lies, can be seen clearly. Moreover, a molded position fixing formation 7 can be seen in the background.

The detailed view C from FIG. 7 is shown in FIG. 10. Here, a molded position fixing formation 7 can firstly be seen which engages into a fixing slot 8 (which cannot be seen) of the printed circuit board 4. Moreover, it can be seen how, in the exemplary embodiment which is shown, the first part of a latching apparatus 10 which is configured as a latching lug is integrally molded on the outer wall 9 of the housing lower part 2. Moreover, it can be seen that the second part of the latching apparatus 11 which is configured as a bracket is integrally molded onto the housing upper part 3.

The molded position fixing formation 7 is configured as a housing rib in the housing lower part 2 and is integrally molded onto the housing inner wall 5. All of these integrally molded constituent parts of the housing lower part 2 and of the housing upper part 3 can be produced using the injection molding method.

FIG. 11 shows a detailed view B from FIG. 8 and shows, in particular, a fixing slot 8, into which a molded position fixing formation 7 engages, in order to fix the position of the printed circuit board 4.

A detailed view A from FIG. 8 is shown in FIG. 12, while a detailed view E from FIG. 14 is shown in FIG. 13 and shows a plan view of the illustration from FIG. 12. A slot 13 can be seen in the printed circuit board 4, which slot 13 runs parallel to the printed circuit board edge 14 and is longer than the spacing of the slot 13 from the printed circuit board edge 14. As a result, an elongate, resilient tab 16 is configured on the printed circuit board 4, which tab 16 is pressed into the housing lower part 2 by way of a pin 19 which is integrally molded onto the housing upper part 3 and projects out of the plane of the housing upper part edge 18, a supporting element 6 serving as a back support for the pin 19.

Tabs 16 of this type which are produced by way of slots 13 are configured at each corner 15 of the printed circuit board, the supporting elements 6 preferably being integrally molded in a rib-shaped manner in the housing lower part 2 adjacently in the housing lower part 2 with respect to the end of the elongate, resilient tab 15.

FIG. 14 shows a section D-D as indicated in FIG. 4, and passes through the housing upper part 3 and therefore shows a plan view of the printed circuit board 4. Here, in addition to the elongate, resilient tab 16 which has already been described in detail in conjunction with FIG. 13, is produced by way of the slot 13 in the printed circuit board 4 and is pressed into the housing lower part by way of a pin 19 in the housing upper part 3, molded position fixing formations 7 can be seen, moreover, which engage into fixing slots 8 of the printed circuit board 4, in order to fix the latter mechanically.

FIG. 15 shows, in particular, how the elongate, resilient tab 16 is pressed into the housing lower part 2 from the plane of the printed circuit board 4 by way of the pins 19 which are integrally molded onto the housing upper part 3 and protrude out of the plane of the housing upper part edge 18, and the printed circuit board 4 is fixed in the process by way of the supporting elements 6 which serve as back support for the pins 19.

Here, FIG. 16 shows a detailed view H, from which the above-described is more clearly apparent.

FIGS. 17 to 20 show perspective views of the housing 1 and the housing lower part 2 in a perspective view, partially in transparent form.

The molded position fixing formations 7 and supporting elements 6 which are integrally molded in the housing lower part 2 onto its inner wall 5 and are both configured as housing ribs are shown. Moreover, the latching lug which is integrally molded onto the housing lower part 2 on its outer wall 9 is shown as first part of a latching apparatus 10.

FIG. 18 shows a perspective illustration of the printed circuit board 4, in which illustration, in particular, the fixing slots 8 and the slots 13 with the tab 6 produced as a result in the corners 15 of the printed circuit board 4 can be seen. It can also be seen that the slots 13 run parallel to the printed circuit board edge 14 which is adjacent with respect to them, and are considerably longer than the spacing from said printed circuit board edge 14. A rest region 17 of the printed circuit board 4 is also indicated, which rest region 17 is configured in each case adjacently with respect to the end of a tab 13, and serves to rest on supporting elements 6 in the housing lower part 2. The printed circuit board 4 is shown in transparent form in FIG. 19, with the result that the constituent parts of the housing lower part 2, as have already been described with respect to FIG. 17, can be seen and are clarified in terms of their interaction with the elements according to the invention of the printed circuit board 4.

Finally, FIG. 20 also shows the housing upper part 3 in a transparent illustration, which housing upper part 3 is placed onto the housing lower part 2 and is latched to the latter by means of the latching apparatus 10, 11, with the result that the pins 19 which are integrally molded onto the housing upper part 3 are placed onto the elongate, resilient tabs 16 and press them into the housing lower part 2, supported by the rest of the printed circuit board 4 on the supporting elements 6 (which is not shown clearly in FIG. 20, however), with the result that the printed circuit board 4 is clamped fixedly in the housing 1 and is additionally fixed by way of the molded position fixing formation 7 of the housing lower part 2, which molded position fixing formation 7 is positioned in fixing slots 8 of the printed circuit board 4.

The geometry of a control unit which consists essentially of three components has therefore been described: housing lower part, printed circuit board and housing upper part. The parts provide protection, and likewise provide an assembly method which is suitable for mass production. The invention can be used here for every type of plug-in connections which are to be used in the case of the control unit.

In summary, the housing lower part has the following topology features:
- four supporting regions, on which the printed circuit board lies during the assembly,
- at least two, preferably four molded position fixing formations, by way of which the position of the printed circuit board is fixed during the assembly in the housing lower part,
- two latching lugs or latching lugs which are arranged outside the housing and serve for connecting to the housing upper part which has corresponding counterparts.

The printed circuit board has the following designs:
- at least two, preferably four fixing slots which interact with the molded position fixing formations of the housing lower part,
- four elongate, flexible tabs in the corners of the printed circuit board. Said tabs on the printed circuit board can be produced by way of conventional manufacturing methods, for example by way of a slot being cut out. Each tab has a region, where the tabs are bent out of the plane of the printed circuit board during further assembly of the housing on account of projecting pins on the housing upper part.

The printed circuit board has dimensions, for example, which lead to an overall area of 9800 mm². An area which cannot be utilized for components, since it serves for centering and fixing the printed circuit board in the housing lower part, takes up approximately from 180 to 200 mm². As a consequence, this leads to an area portion of approximately 2%.

The housing upper part has the following features:
- four pins which project out of the plane of the edge of the housing upper part, are seated on the printed circuit board tabs, and bend the latter in the finally mounted state,
- at least two, preferably four molded position fixing formations which are aligned with the centering projections of the housing lower part and the centering recesses of the printed circuit board and interact with them in the assembled state,
- furthermore, two snap-action hooks which interact with the latching lugs of the housing lower part, in order to hold the housing upper part and housing lower part together.

The invention claimed is:

1. A housing for an electronic circuit with a housing lower part, with a housing upper part and with a printed circuit board which is arranged in the housing and serves to receive the electronic circuit,
    the housing lower part being of tub-shaped configuration and having in each case at least two supporting elements for the printed circuit board on at least two inner walls which lie opposite one another, having, moreover, in each case at least one molded position fixing formation on at least two inner walls which lie opposite one another, which molded position fixing formation serves to engage into a matching fixing slot in the printed circuit board to positionally fix the printed circuit board, and, moreover, having in each case one first part of a latching apparatus for connecting to the housing upper part on at least two outer walls which lie opposite one another,
    the printed circuit board being of rectangular configuration and having fixing slots for receiving the molded position fixing formations of the housing lower part on at least two sides which lie opposite one another,
    and, at its four corners, the printed circuit board having in each case one slot which runs parallel to that inner wall of the housing lower part to which the supporting elements are attached, the length of a slot being greater than the spacing of the slot from the adjacent printed circuit board edge, with the result that an elongate, resilient tab is formed at each corner of the printed circuit board,
    the housing upper part being of tub-shaped configuration and, at its four corners, having pins which protrude out of the plane of the housing upper part edge for pressing the tabs which are configured on the printed circuit board out of the printed circuit board plane into the housing lower part in the assembled state of the housing, and, moreover, having in each case one second part of the latching apparatus for connecting to the housing lower part on at least two outer walls which lie opposite one another.

2. The housing as claimed in claim 1, wherein the latching apparatus is formed with a latching lug as first part and a resilient bracket as second part, or vice versa.

3. The housing as claimed in claim 1, wherein at least one molded position fixing formation is arranged on each inner wall of the housing lower part.

4. The housing as claimed in claim 1, wherein the position fixing formations are configured as housing ribs.

5. The housing as claimed in claim 1, wherein the supporting elements are configured as housing ribs.

6. The housing as claimed in claim 1, wherein the supporting elements are arranged in the housing lower part in such a way that the printed circuit board comes to lie on them with rest regions which lie in a direct extension of ends of the resilient tabs.

\* \* \* \* \*